(12) United States Patent
Weatherspoon et al.

(10) Patent No.: US 10,056,670 B2
(45) Date of Patent: Aug. 21, 2018

(54) METHOD FOR MAKING ELECTRICAL STRUCTURE WITH AIR DIELECTRIC AND RELATED ELECTRICAL STRUCTURES

(71) Applicant: HARRIS CORPORATION, Melbourne, FL (US)

(72) Inventors: Michael Raymond Weatherspoon, West Melbourne, FL (US); Louis Joseph Rendek, Jr., Melbourne, FL (US); Lawrence Wayne Shacklette, Melbourne, FL (US); Robert Patrick Maloney, Colorado Springs, CO (US); David M. Smith, Sebastian, FL (US)

(73) Assignee: HARRIS CORPORATION, Melbourne, FL (US)

( * ) Notice: Subject to any disclaimer, the term of this patent is extended or adjusted under 35 U.S.C. 154(b) by 376 days.

(21) Appl. No.: 14/857,943

(22) Filed: Sep. 18, 2015

(65) Prior Publication Data
US 2016/0006100 A1 Jan. 7, 2016

Related U.S. Application Data

(62) Division of application No. 13/253,388, filed on Oct. 5, 2011, now Pat. No. 9,142,497.

(51) Int. Cl.
*H01P 3/12* (2006.01)
*H05K 3/46* (2006.01)
(Continued)

(52) U.S. Cl.
CPC .......... *H01P 3/121* (2013.01); *H01L 21/4846* (2013.01); *H01L 23/498* (2013.01);
(Continued)

(58) Field of Classification Search
CPC ... H01L 21/4846; H01L 23/498; H01L 23/66; H01L 2223/6627; H01L 2924/0002;
(Continued)

(56) References Cited

U.S. PATENT DOCUMENTS 3,157,847 A  11/1964 Williams
4,933,743 A  6/1990 Thomas et al.
(Continued)

FOREIGN PATENT DOCUMENTS

WO  2004004061  1/2004
WO  2010073639  7/2010

OTHER PUBLICATIONS

Muller et al. "Surface-mountable metalized plastic waveguide filter suitable for high volumne production", Oct. 2003, Microwave Conference 2003 33rd, pp. 1255-1258.*
(Continued)

*Primary Examiner* — Rakesh Patel
*Assistant Examiner* — Jorge Salazar, Jr.
(74) *Attorney, Agent, or Firm* — Allen, Dyer, Doppelt + Gilchrist, P.A.

(57) ABSTRACT

A method has been described for making an electrical structure having an air dielectric and includes forming a first subunit including a sacrificial substrate, an electrically conductive layer including a first metal on the sacrificial substrate, and a sacrificial dielectric layer on the sacrificial substrate and the electrically conductive layer. The method further includes forming a second subunit including a dielectric layer and an electrically conductive layer thereon including the first metal, and coating a second metal onto the first metal of one or more of the first and second subunits. The method also includes aligning the first and second subunits together, heating and pressing the aligned first and second subunits to form an intermetallic compound of the first and
(Continued)

second metals bonding adjacent metal portions together, and removing the sacrificial substrate and sacrificial dielectric layer to thereby form the electrical structure having the air dielectric.

21 Claims, 4 Drawing Sheets

(51) Int. Cl.
*H01L 23/498* (2006.01)
*H01L 21/48* (2006.01)
*H01L 23/66* (2006.01)

(52) U.S. Cl.
CPC ........... *H01L 23/66* (2013.01); *H05K 3/4614* (2013.01); *H01L 2223/6627* (2013.01); *H01L 2924/0002* (2013.01); *H05K 3/4697* (2013.01); *H05K 2201/0141* (2013.01); *H05K 2203/016* (2013.01); *H05K 2203/308* (2013.01)

(58) Field of Classification Search
CPC ........ H01L 2924/00; H01P 3/121; H01P 3/12; H01P 3/16; H05K 3/4614; H05K 2201/0141; H05K 2203/016; H05K 2203/308; H05K 3/4697
USPC ......................................... 333/24 R, 248, 254
See application file for complete search history.

(56) References Cited

U.S. PATENT DOCUMENTS

| | | | |
|---|---|---|---|
| 5,381,596 A | 1/1995 | Ferro | |
| 5,453,154 A | 9/1995 | Thomas et al. | |
| 5,949,311 A * | 9/1999 | Weiss | H01P 1/215 333/202 |
| 6,101,705 A | 8/2000 | Wolfson et al. | |
| 6,362,706 B1 * | 3/2002 | Song | H01P 5/107 333/219 |
| 6,430,805 B1 | 8/2002 | Ekmekji et al. | |
| 6,882,762 B2 | 4/2005 | Brist et al. | |
| 7,012,489 B2 | 3/2006 | Sherrer et al. | |
| 7,148,772 B2 | 12/2006 | Sherrer et al. | |
| 7,405,638 B2 | 7/2008 | Sherrer et al. | |
| 7,480,435 B2 | 1/2009 | Brist et al. | |
| 7,534,696 B2 | 5/2009 | Jahnes et al. | |
| 7,656,256 B2 | 2/2010 | Houck et al. | |
| 7,847,410 B2 | 12/2010 | Lee et al. | |
| 7,898,356 B2 | 3/2011 | Sherrer et al. | |
| 7,948,335 B2 | 5/2011 | Sherrer et al. | |
| 9,142,497 B2 * | 9/2015 | Weatherspoon | H01L 23/498 |
| 2003/0107459 A1 * | 6/2003 | Takahashi | H01P 1/2088 333/230 |
| 2005/0067292 A1 | 3/2005 | Thompson et al. | |
| 2005/0245063 A1 | 11/2005 | Chinthakindi et al. | |
| 2005/0266214 A1 | 12/2005 | Usui et al. | |
| 2007/0045121 A1 | 3/2007 | Cohen et al. | |
| 2007/0259516 A1 | 11/2007 | Jahnes et al. | |
| 2007/0274656 A1 | 11/2007 | Brist et al. | |
| 2008/0014668 A1 | 1/2008 | Brist et al. | |
| 2009/0289746 A1 * | 11/2009 | Ligander | H01P 1/208 333/208 |
| 2010/0200968 A1 | 8/2010 | Purden et al. | |
| 2010/0296252 A1 | 11/2010 | Rollin et al. | |
| 2011/0194240 A1 * | 8/2011 | Hansen | G06F 1/1698 361/679.28 |
| 2011/0262697 A1 | 10/2011 | Katsurayama et al. | |
| 2013/0087365 A1 | 4/2013 | Weatherspoon et al. | |

OTHER PUBLICATIONS

Sherrer et al., "PolyStrata Technology: A disruptive approach for 3D Microwave Components and Modules", Nuvotronics, 2008, slides 1-39. See Priority U.S. Appl. No. 13/253,388, filed Oct. 5, 2011.

* cited by examiner

METHOD FOR MAKING ELECTRICAL STRUCTURE WITH AIR DIELECTRIC AND RELATED ELECTRICAL STRUCTURES

FIELD OF THE INVENTION

The present invention relates to the field of multilayer circuit boards, and, more particularly, to electrical structures with air dielectrics and related methods.

BACKGROUND OF THE INVENTION

An electronic device may include one or more circuit boards. A typical circuit board is a planar board that mechanically supports electronic components. The electronic components may comprise, for example, resistors, capacitors, switches, batteries, and other more complex integrated circuit components, i.e. microprocessors. The circuit board typically comprises a dielectric material, for example, a polymer material.

The circuit board may include conductive traces on the surface for connecting the electronic components to each other. As electronic circuitry has become more complex, multilayer circuit boards with at least two electrically conductive pattern layers have been developed. Typically, the different conductive trace layers of a multilayer circuit board may be connected through vertically extending vias, which comprise conductive materials, for example, metal.

A typical multilayer circuit board may comprise a plurality of core layers with bonding layers therebetween affixing the adjacent core layers together. Each core layer typically includes a dielectric layer with electrically conductive pattern layers on the opposing surfaces of the dielectric layer. Typically, during manufacture of the multilayer circuit boards, the core and bonding layers are stacked together and then heated and compressed (laminated) to cause the bonding layer to affix the adjacent core layers together.

One exemplary multilayer circuit board is a board that comprises an air-core dielectric waveguide structure. In other words, the multilayer circuit board includes a conductive core for transmitting the signal while adjacent portions of the multilayer circuit board provide an open area of air around the conductive core. As will be appreciated by those skilled in the art, the air-core serves as a dielectric material surrounding the conductive core and provides for reduced loss and reduced loading effects in the conductive core.

For example, U.S. Pat. No. 7,656,256 to Houck et al. discloses forming a multilayer circuit board to provide a coaxial air-core waveguide. The waveguide includes outer conductive layers forming a box-like outer conductor structure, and a pair of support arms extending inwardly from the outer conductive layers to support the inner conductor. The waveguide is formed during a multi-step process using a base substrate.

U.S. Pat. Nos. 7,405,638, 7,948,335, 7,148,772, and 7,012,489 to Sherrer et al. also disclose a coaxial air-core waveguide. The waveguide includes outer conductive layers forming a box-like structure, and a single lateral support arm extending inwardly from one of the outer conductive layers to support the inner conductor. In another embodiment, the support arm may extend from the bottom conductive layer to define a pedestal support arm. In one embodiment, the waveguides may be stacked to provide a plurality of coaxial waveguides.

U.S. Pat. No. 7,898,356 to Sherrer et al. also discloses a coaxial air-core waveguide. This coaxial air-core waveguide includes a single lateral support arm extending between opposing outer conductive layers.

In the typical approach to manufacturing air-core waveguide radio frequency (RF) structures, the process may include mature wafer lithographic build up on wafer substrates. When these devices are finished and are to be integrated onto a device wafer, the air-core waveguide RF structure may have to be diced and wire bonded to the appropriate next level assembly. Vibration from the dicing process may place the air-core waveguide RF structures at risk.

A second possible approach involves direct build-up of air core RF structures on the device wafer itself. Damascene-based formation of these air core conductive traces, and the associated chemical mechanical polishing (CMP) process may add risk to the integrity of the device wafer. Typical wafer substrates may not offer the most optimum RF properties for an RF substrate. Additionally, the thickness of the typical rigid wafer substrate may add undesirable size to the packaging of the air-core waveguide RF structure. For example, it impairs the use of the article in a restricted space.

SUMMARY OF THE INVENTION

In view of the foregoing background, it is therefore an object of the present invention to provide an effective method for making an electrical structure having an air dielectric on an RF-capable substrate.

This and other objects, features, and advantages in accordance with the present invention are provided by a method of making an electrical structure having an air dielectric. The method includes forming a first subunit comprising a sacrificial substrate, an electrically conductive layer comprising a first metal on the sacrificial substrate, and a sacrificial dielectric layer on the sacrificial substrate and the electrically conductive layer, and forming a second subunit comprising a dielectric layer and an electrically conductive layer thereon comprising the first metal. The method also includes coating a second metal onto the first metal of at least one of the first and second subunits, aligning the first and second subunits together, and heating and pressing the aligned first and second subunits to form an intermetallic compound of the first and second metals bonding adjacent metal portions together. The method further includes removing the sacrificial substrate and sacrificial dielectric layer to thereby form the electrical structure having the air dielectric. Advantageously, the product resulting from this method may be more flexible and robust than the typical methods of manufacture.

Another aspect is directed to an electrical structure that comprises a first subunit comprising a free-standing electrically conductive circuit surrounded by an air dielectric, the free-standing electrically conductive circuit comprising a first metal. The electrical structure includes a second subunit comprising a dielectric layer and an electrically conductive layer thereon comprising the first metal, and an intermetallic compound of the first metal and a second metal bonding adjacent metal portions together of the first and second subunits.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
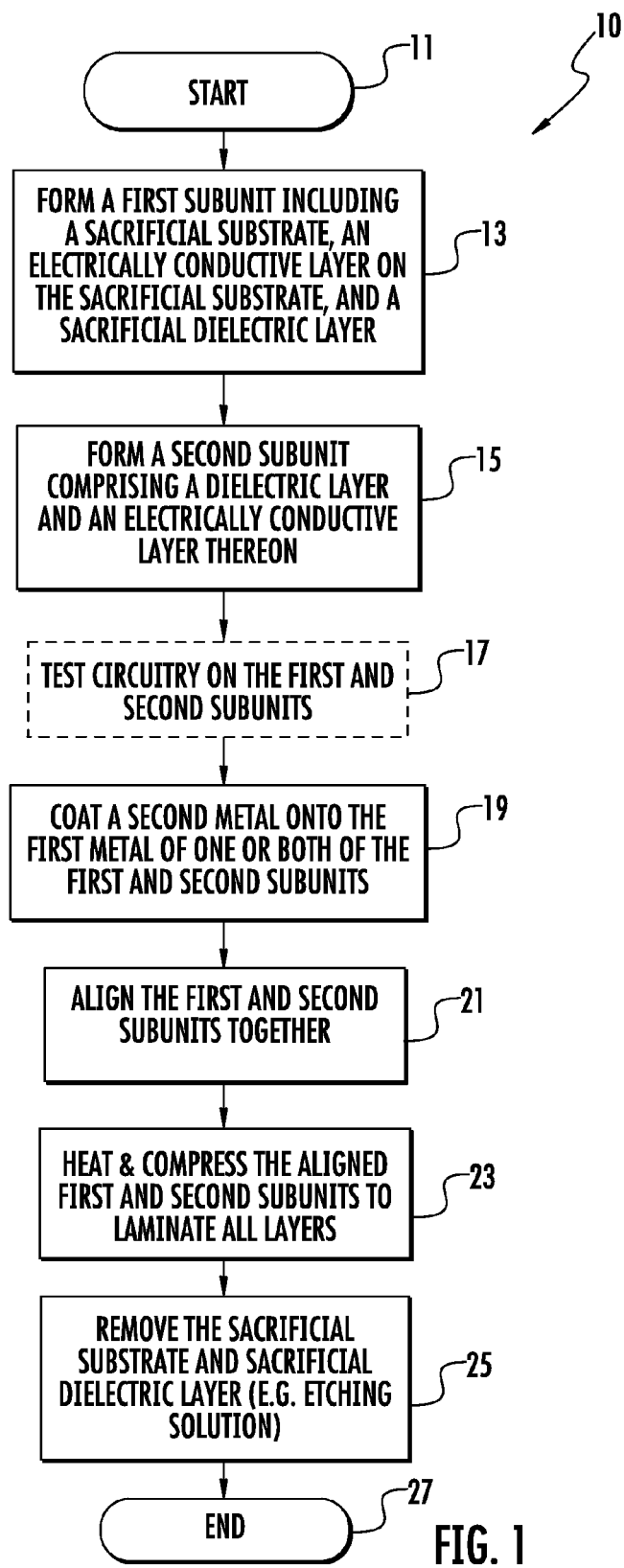
FIG. 1 is a flowchart illustrating a method, according to the present invention.
Figure 2A:
FIGS. 2A-2F are schematic cross-sectional views of the device during the fabrication steps in accordance with the present invention.
Figure 2B:
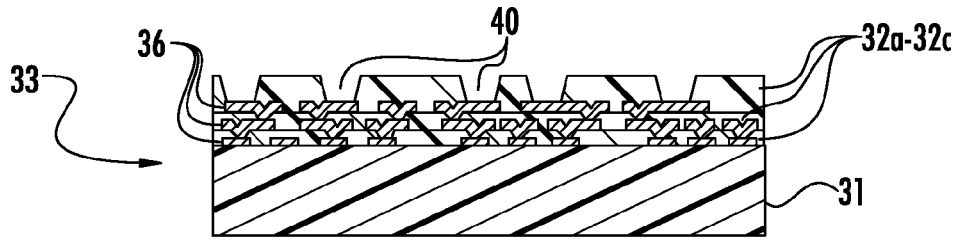
Figure 2C:
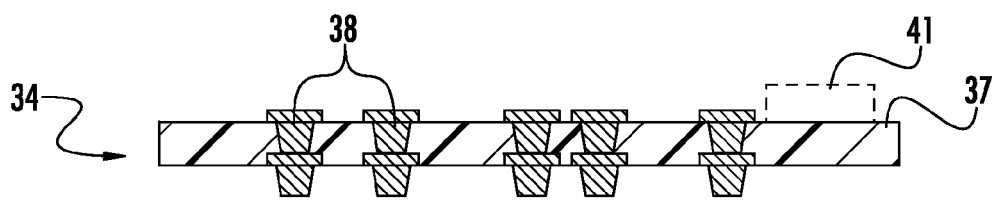
Figure 2D:
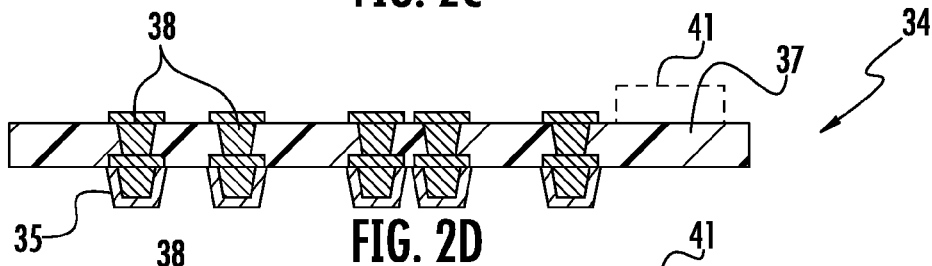
Figure 2E:
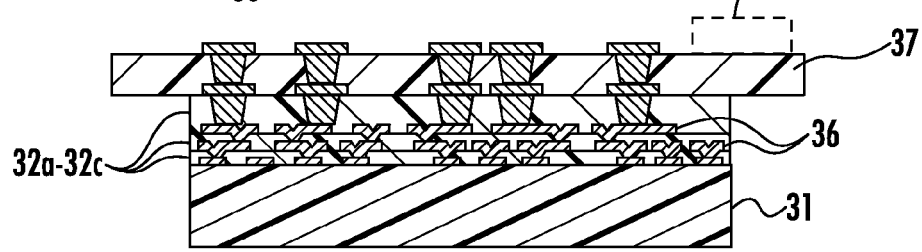
Figure 2F:
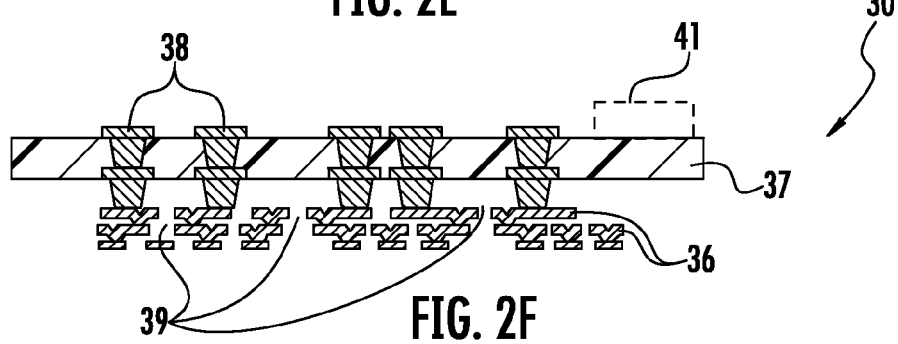

Referring initially to FIGS. 1 and 2A-2F, a method of making an electrical structure 30 (FIG. 2F) according to the present invention is now described with reference to a flowchart 10 (FIG. 1), which begins at Block 11 (FIG. 1). In particular, the finished electrical structure 30 (FIG. 2F) illustratively includes an air dielectric interlayer 39 (FIG. 2F).

The method includes at Block 13 (FIG. 1) forming a first subunit 33 (FIG. 2B). The first subunit 33 includes a sacrificial substrate 31 (FIGS. 2A, 2B and 2E), a plurality of electrically conductive layers 36 (FIGS. 2B, 2E and 2F) comprising a first metal on the sacrificial substrate, and interlayer sacrificial dielectric layers 32a-32c (FIG. 2B) on the sacrificial substrate and the electrically conductive layers, i.e. the sacrificial dielectric layers are integrated with the electrically conductive layers to provide temporary structural support. For example, the first metal may comprise copper, etc. Also, the sacrificial substrate 31 may comprise a glass substrate, for example. Most preferably, the glass material contains silicon dioxide as a major component. The sacrificial dielectric layers 32a-32c may comprise an oxide, for example, oxides such as silicon dioxide, or a photoresist. As perhaps best seen in FIG. 2B, the uppermost sacrificial dielectric layer 32a includes recessed cavities 40 therein. These recessed cavities 40 can be formed through a number of methods, including various typical wet chemical processes or dry etching (reactive ion etch, plasma etching, or ion beam techniques).

The method at Block 15 (FIG. 1) also includes forming a second subunit 34 (FIG. 2C). The second subunit 34 comprises a dielectric layer 37 (FIG. 2C-2F) and a plurality of electrically conductive layers 38 (FIG. 2C-2F) thereon comprising the first metal. For example, the dielectric layer 37 may comprise liquid crystal polymer (LCP) or Kapton®, a polyimide film available from DowDuPont, Inc. of Wilmington, Delaware, among other dielectric materials. As shown in the illustrated embodiment, the electrically conductive layers 38 include through-vias through the second subunit 34. In particular, the through-vias protrude from a major surface of the second subunit 34 and are formed to provide structure supports in the finished device.

More specifically, the forming of the second subunit 34 may optionally comprise forming the second subunit to include at least one circuit 41 (FIG. 2C-2F), shown with dashed lines, on the dielectric layer 37 and coupled to the electrically conductive layers 38. Also shown with dashed lines, the method optionally includes testing the circuit 41 and the conductive traces of the first and second subunits 33-34 (e.g. continuity checks) before heating the aligned first and second subunits 33-34. (Block 17). Advantageously, this method provides easy access to the circuit 41 and the conductive traces of the first and second subunits 33-34, thereby making the testing process easier to implement than in typical manufacturing methods.

The method also includes coating a second metal layer 35 (FIG. 2D) onto the first metal (electrically conductive layers 38) of the second subunit 34 (FIG. 2D) as mentioned in FIG. 1 Block 19. For example, the second metal may comprise tin. Of course, in other embodiments, the second metal 35 may be coated onto the first metal (electrically conductive layers 36) of the first subunit 33 or both the first and second subunits. By coating, this is meant to include covering at least a part of the first metal, although in some embodiments, a complete coating of the exposed first metal portions may be performed as will be appreciated by those skilled in the art.

Referring now additionally to FIGS. 2E-2F, the method also includes aligning the first and second subunits 33-34) together as mentioned in FIG. 1 Block 21. More specifically, the recessed cavities 40 of the first subunit 33 are aligned to be adjacent with the protruding portions of the through-vias (electrically conductive layers 38) of the second subunit 34. The method also includes heating and pressing the aligned first and second subunits 33-34 to form an intermetallic compound (at the coupling of the recessed cavities 40 and the protruding portions of the through-vias) of the first and second metals bonding adjacent metal portions together as mentioned in FIG. 1 Block 23. In particular, the first metal has a melting point temperature greater than that of the second metal, and the melting point temperature of the second metal is below the lamination temperature of the dielectric layers 32a-32c, 37. Accordingly, the dielectric layers 32a-32c, 37 may be laminated together while at the same time, the adjacent metal portions from the first and second subunits 33-34 are joined together while the conductive traces formed from the first metal are left intact.

For example, in copper-tin embodiments, the intermetallic compound comprises an intermetallic copper-tin compound. In embodiments that use LCP dielectric layers, the aligned first and second subunits 33-34 are subjected to 270° C. and 200 PSI (lamination temperature and pressure of LCP), which is above the melting point of tin, but not that of copper. For example, the aligned dielectric layers 32a-32c, 37 of the first and second subunits 33-34 may be laminated together in an autoclave, which advantageously provides for prevention of oxidation and uses isostatic pressure and can prevent circuit board layer mis-registration and squeeze out, both of which can improve dimensional stability.

Lastly, the method further includes removing the sacrificial substrate 31 and sacrificial dielectric layers 32a-32c to thereby form the electrical structure 30 having the air dielectric as mentioned in FIG. 1 Blocks 25 & 27. For example, the electrical structure 30 may be formed to comprise an air dielectric core waveguide or an air dielectric coaxial waveguide. For example, the removing of the sacrificial substrate 31 and sacrificial dielectric layers 32a-32c may comprise using an etching solution, such as hydrofluoric acid or hydrochloric acid. In advantageous embodiments where the sacrificial dielectric layers 32a-32c and the sacrificial substrate 31 both comprise glass, the sacrificial components may be dissolved simultaneously using the Hydrofluoric Acid.

Figure 3:
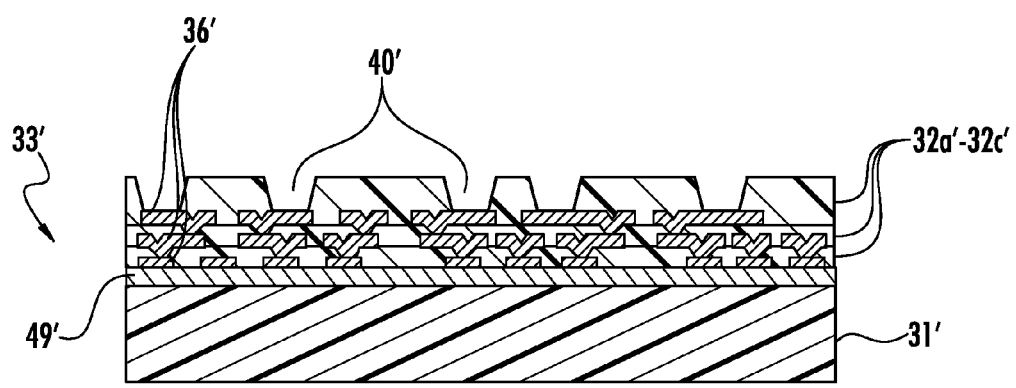
FIG. 3 is a schematic cross-sectional view of another embodiment of the device during the fabrication steps in accordance with the present invention

Referring now to FIG. 3, another embodiment of the first subunit 33 is now described. In this embodiment of the first subunit 33', those elements already discussed above with respect to FIGS. 1-2F are given prime notation and most require no further discussion herein. This embodiment differs from the previous embodiment in that the first subunit 33 comprises a sacrificial layer 49' between the sacrificial substrate 31' and the sacrificial dielectric layers 32a'-32c'. For example, this sacrificial layer 49' may comprise aluminum.

The sacrificial dielectric layers 32a'-32c' would comprise photoresist in these embodiments, which could withstand temperatures up to 290° C. (above the lamination temperature). Subsequently, the photoresist sacrificial dielectric layers 32a-32c' would be dissolved using acetone, for example. The first subunit 33' could also include supporting structures, which would comprise polyimide or SU-8, as will be appreciated by those skilled in the art, SU-8 is an epoxy-based negative photoresist.

TABLE 1

| Material | Acetone Resistant | HCL Resistant | HF Resistant |
|---|---|---|---|
| Glass | Insoluble | Insoluble | Soluble |
| Copper | Insoluble | Insoluble | Insoluble |
| Aluminum | Insoluble | Soluble | Soluble |
| LCP | Insoluble | Insoluble | Insoluble |
| Polyimide | Insoluble | Insoluble | Insoluble |
| SU-8 | Insoluble | Insoluble | Insoluble |
| Photoresist | Soluble | Insoluble | Insoluble |

As shown in Table 1, the sacrificial dielectric layers 32a'-32c' and the sacrificial substrate 31' may comprise several different compounds and can be removed selectively based upon their solubility properties. Of course, this flexibility may apply to other embodiments also.

Figure 4:
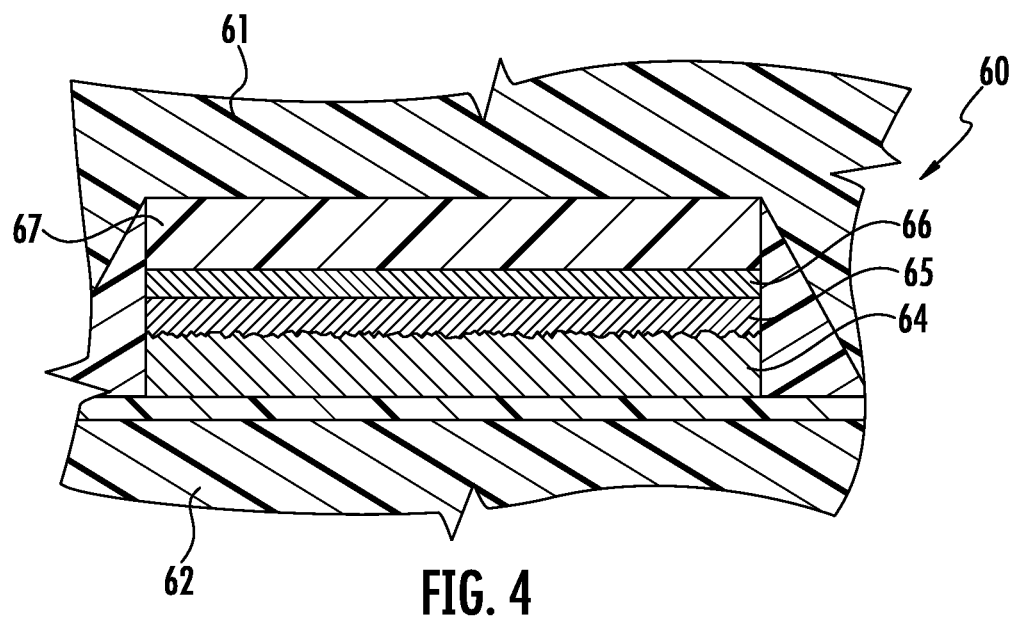
FIG. 4 is an enlarged cross-sectional view of another portion of the device according to the present invention.

Referring now additionally to FIG. 4, for embodiments including tin as the second metal and copper as the first metal, the intermetallic joint compound 60 comprises $Cu_3Sn$. Advantageously, this compound is stable and has a melting point greater than 600° C. The intermetallic joint compound 60 is sandwiched between the circuit board layers 61-62 and illustratively includes the copper conductive trace 64, a $Cu_3Sn$ layer 65, a copper layer 66 from the opposing copper conductive trace, and a sacrificial dielectric layer 67.

Advantageously, the above disclosed method for making the electrical structure 30 provides passive components on an organic substrate, such as LCP. This method enables the construction of a hybrid device with fine feature sizes combined with the advantages of thick copper on a low loss dielectric material up to 110 GHz. This method may accommodate both RF and digital circuitry on a single substrate and may enable the fabrication of a micro miniaturized phased array antenna and associated circuitry. Moreover, circuitry for the antenna element can be directly fabricated on the LCP layers. Thin film transfer may provide very low loss transmission lines to the antenna element.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electrical structure comprising:
   a first subunit comprising a free-standing electrically conductive circuit surrounded by an air dielectric, said free-standing electrically conductive circuit comprising a first metal;
   a second subunit comprising a dielectric layer and an electrically conductive layer thereon comprising the first metal; and
   an intermetallic compound formed of the first metal of said first and second subunits and a second metal for bonding adjacent portions of the first metal together of said first and second subunits to define an air dielectric core waveguide.

2. The electrical structure of claim 1 wherein said dielectric layer comprises liquid crystal polymer (LCP).

3. The electrical structure of claim 1 wherein the first metal comprises copper.

4. The electrical structure of claim 1 further comprising a circuit on said dielectric layer and the circuit is coupled to said electrically conductive layer.

5. The electrical structure of claim 1 wherein the second metal comprises tin.

6. The electrical structure of claim 1 further comprising radio frequency (RF) circuitry and digital circuitry on said dielectric layer.

7. The electrical structure of claim 1 wherein said dielectric layer comprises a polyimide film.

8. An electrical structure comprising:
   a first subunit comprising a free-standing electrically conductive circuit surrounded by an air dielectric, said free-standing electrically conductive circuit comprising copper;
   a second subunit comprising a liquid crystal polymer (LCP) layer and an electrically conductive layer thereon comprising copper; and
   an intermetallic compound formed of the copper of said first and second subunits and tin for bonding adjacent portions of the copper together of said first and second subunits to define an air dielectric core waveguide.

9. The electrical structure of claim 8 further comprising a circuit on said LCP layer and the circuit is coupled to said electrically conductive layer.

10. The electrical structure of claim 8 further comprising radio frequency (RF) circuitry and digital circuitry on said LCP layer.

11. An electrical structure comprising:
   a first subunit comprising a free-standing electrically conductive circuit surrounded by an air dielectric, said free-standing electrically conductive circuit comprising a first metal;
   a second subunit comprising a liquid crystal polymer (LCP) layer and an electrically conductive layer thereon comprising the first metal;
   an intermetallic compound formed of the first metal of said first and second subunits and a second metal for bonding adjacent portions of the first metal together of said first and second subunits to define an air dielectric core waveguide;
   radio frequency (RF) circuitry on said LCP layer; and
   digital circuitry on said LCP layer.

12. The electrical structure of claim 11 wherein the first metal has a melting point temperature greater than that of the second metal; and wherein a melting point temperature of the second metal is below a lamination temperature of the LCP layer.

13. The electrical structure of claim 11 wherein the first metal comprises copper.

14. The electrical structure of claim 11 wherein the second metal comprises tin.

15. An electrical structure comprising:
 a first subunit comprising a free-standing electrically conductive circuit surrounded by an air dielectric, said free-standing electrically conductive circuit comprising a first metal;
 a second subunit comprising a dielectric layer and an electrically conductive layer thereon comprising the first metal; and
 an intermetallic compound formed of the first metal of said first and second subunits and a second metal for bonding adjacent first metal portions together of said first and second subunits to define an air dielectric core waveguide;
 the first metal having a melting point temperature greater than that of the second metal, and a melting point temperature of the second metal being below a lamination temperature of the dielectric layer.

16. The electrical structure of claim 15 wherein said dielectric layer comprises liquid crystal polymer (LCP).

17. The electrical structure of claim 15 wherein the first metal comprises copper.

18. The electrical structure of claim 15 further comprising a circuit on said dielectric layer and the circuit is coupled to said electrically conductive layer.

19. The electrical structure of claim 15 wherein the second metal comprises tin.

20. The electrical structure of claim 15 further comprising radio frequency (RF) circuitry and digital circuitry on said dielectric layer.

21. The electrical structure of claim 15 wherein said dielectric layer comprises a polyimide film.

* * * * *